United States Patent
Okubo

(10) Patent No.: US 11,811,447 B2
(45) Date of Patent: Nov. 7, 2023

(54) MULTIPLEXER

(71) Applicant: Murata Manufacturing Co., Ltd., Nagaokakyo (JP)

(72) Inventor: Kota Okubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 233 days.

(21) Appl. No.: 16/929,170

(22) Filed: Jul. 15, 2020

(65) Prior Publication Data
US 2021/0058109 A1 Feb. 25, 2021

(30) Foreign Application Priority Data

Aug. 21, 2019 (JP) .................................. 2019-150855

(51) Int. Cl.
*H04B 1/50* (2006.01)
*H03H 9/60* (2006.01)
(Continued)

(52) U.S. Cl.
CPC .............. *H04B 1/50* (2013.01); *H03F 3/245* (2013.01); *H03H 9/542* (2013.01); *H03H 9/605* (2013.01);
(Continued)

(58) Field of Classification Search
CPC ......... H04B 1/50; H04B 1/0057; H03F 3/245; H03F 2200/294; H03F 2200/451; H03F 1/565; H03F 2200/111; H03F 3/195; H03F 3/72; H03F 2203/7209; H03H 9/542; H03H 9/605; H03H 9/70; H03H 9/547; H03H 9/6409; H03H 9/6483; H03H 9/706;
(Continued)

(56) References Cited

U.S. PATENT DOCUMENTS 6,262,637 B1 * 7/2001 Bradley ................. H03H 9/706
333/191
6,525,624 B1 * 2/2003 Hikita ...................... H03H 9/72
333/133
(Continued)

FOREIGN PATENT DOCUMENTS

JP 2007202136 A 8/2007
JP 2014033377 A 2/2014
(Continued)

OTHER PUBLICATIONS

Office Action in JP2019-150855, dated May 31, 2023, 4 pages.

*Primary Examiner* — Jinsong Hu
*Assistant Examiner* — Rui M Hu
(74) *Attorney, Agent, or Firm* — KEATING & BENNETT, LLP

(57) ABSTRACT

A multiplexer includes a band pass filter configured to pass a signal in a predetermined frequency band between a first terminal and a common terminal connected to an antenna, and a band elimination filter configured to attenuate a signal in the predetermined frequency band between a second terminal and the common terminal and includes resonators connected in series with a line between the second terminal and the common terminal. The resonators include a first resonator having a lowest resonant frequency and a second resonator disposed on a side of the common terminal from the first resonator.

18 Claims, 14 Drawing Sheets

(51) Int. Cl.
  *H03H 9/70* (2006.01)
  *H03F 3/24* (2006.01)
  *H04B 1/00* (2006.01)
  *H03H 9/54* (2006.01)

(52) U.S. Cl.
  CPC ............. *H03H 9/70* (2013.01); *H04B 1/0057* (2013.01); *H03F 2200/294* (2013.01); *H03F 2200/451* (2013.01)

(58) Field of Classification Search
  CPC ........ H03H 9/725; H03H 9/52; H03H 9/6413; H03H 9/72; H03H 7/175; H03H 9/6456
  See application file for complete search history.

(56) References Cited

U.S. PATENT DOCUMENTS

| | | | |
|---|---|---|---|
| 6,975,185 B2 | 12/2005 | Tsutsumi et al. | |
| 9,184,782 B2 | 11/2015 | Taniguchi | |
| 9,577,606 B2* | 2/2017 | Link | H03H 7/38 |
| 9,595,941 B2 | 3/2017 | Nishihara et al. | |
| 10,651,821 B2 | 5/2020 | Kido | |
| 2003/0058066 A1* | 3/2003 | Taniguchi | H03H 9/6483 |
| | | | 333/193 |
| 2006/0139120 A1* | 6/2006 | Yamaguchi | H03H 9/6483 |
| | | | 333/195 |
| 2007/0080756 A1* | 4/2007 | Aigner | H03H 9/706 |
| | | | 333/133 |
| 2007/0159274 A1 | 7/2007 | Onzuka | |
| 2008/0252397 A1* | 10/2008 | Stuebing | H03H 9/605 |
| | | | 333/189 |
| 2010/0074240 A1* | 3/2010 | Jian | H04B 1/0057 |
| | | | 370/339 |
| 2010/0109801 A1* | 5/2010 | Inoue | H03H 9/725 |
| | | | 333/186 |
| 2010/0194494 A1* | 8/2010 | Inoue | H03H 9/0028 |
| | | | 333/133 |
| 2011/0090026 A1* | 4/2011 | Nakahashi | H03H 9/14594 |
| | | | 333/195 |
| 2011/0235557 A1* | 9/2011 | Jian | H04B 1/50 |
| | | | 455/39 |
| 2012/0182088 A1* | 7/2012 | Inoue | H03H 9/725 |
| | | | 333/133 |
| 2012/0218052 A1* | 8/2012 | Tsurunari | H03H 9/02559 |
| | | | 333/133 |
| 2012/0274421 A1* | 11/2012 | Hara | H03H 9/0222 |
| | | | 333/195 |
| 2012/0286895 A1* | 11/2012 | Hara | H03H 9/725 |
| | | | 333/133 |
| 2012/0293277 A1* | 11/2012 | Hara | H03H 9/132 |
| | | | 333/133 |
| 2013/0039228 A1* | 2/2013 | Caron | H04B 1/52 |
| | | | 370/278 |
| 2013/0099875 A1* | 4/2013 | Shimizu | H03H 9/25 |
| | | | 333/195 |
| 2013/0113576 A1* | 5/2013 | Inoue | H03H 9/70 |
| | | | 333/195 |
| 2013/0162368 A1* | 6/2013 | Tsurunari | H03H 9/725 |
| | | | 333/195 |
| 2014/0113580 A1* | 4/2014 | Yamazaki | H03H 9/6483 |
| | | | 455/307 |
| 2014/0218129 A1* | 8/2014 | Fujiwara | H03H 9/70 |
| | | | 333/195 |
| 2014/0289692 A1* | 9/2014 | Fenzi | G06F 30/30 |
| | | | 716/122 |
| 2014/0320236 A1* | 10/2014 | Silver | H03H 9/64 |
| | | | 333/186 |
| 2015/0054597 A1* | 2/2015 | Yasuda | H03H 9/6423 |
| | | | 333/195 |
| 2016/0112025 A1* | 4/2016 | Nishimura | H03H 7/463 |
| | | | 333/132 |
| 2016/0156335 A1 | 6/2016 | Takeuchi | |
| 2016/0294423 A1* | 10/2016 | Yatsenko | H03H 9/605 |
| 2017/0244431 A1* | 8/2017 | Araki | H04J 1/045 |
| 2017/0264336 A1* | 9/2017 | Saji | H04L 5/14 |
| 2017/0366166 A1* | 12/2017 | Hey-Shipton | H03H 9/6483 |
| 2017/0373668 A1* | 12/2017 | Nishihara | H03H 9/568 |
| 2018/0019509 A1* | 1/2018 | Yasuda | H01P 5/12 |
| 2018/0034443 A1* | 2/2018 | Nakazawa | H03H 9/14541 |
| 2018/0041190 A1* | 2/2018 | Yoshimura | H03H 1/0007 |
| 2018/0152210 A1* | 5/2018 | Araki | H04B 1/40 |
| 2018/0323769 A1* | 11/2018 | Yamamoto | H03H 9/25 |
| 2019/0036554 A1* | 1/2019 | Ito | H03H 9/14582 |
| 2019/0044548 A1* | 2/2019 | Freisleben | H04B 1/0057 |
| 2019/0181834 A1* | 6/2019 | Bauder | H04B 1/0057 |
| 2019/0181907 A1* | 6/2019 | Pfann | H04B 1/0057 |
| 2019/0303524 A1* | 10/2019 | Fenzi | G06F 30/392 |
| 2019/0334563 A1* | 10/2019 | Elbrecht | H04B 1/0057 |
| 2019/0341910 A1* | 11/2019 | Pang | H03H 9/171 |
| 2020/0028492 A1* | 1/2020 | Ta | H03H 9/605 |
| 2020/0083864 A1* | 3/2020 | Jeong | H03H 9/6483 |
| 2020/0106419 A1* | 4/2020 | Hornsteiner | H03H 9/706 |
| 2020/0169240 A1* | 5/2020 | Cheon | H03H 9/6483 |
| 2020/0358424 A1* | 11/2020 | Kaneda | H03H 9/02834 |

FOREIGN PATENT DOCUMENTS

| | | |
|---|---|---|
| KR | 10-2016-0096225 A | 8/2016 |
| KR | 10-2016-0117285 A | 10/2016 |
| WO | 2010/001522 A1 | 1/2010 |
| WO | 2015019794 A1 | 2/2015 |
| WO | 2018/030277 A1 | 2/2018 |

* cited by examiner

MULTIPLEXER

CROSS REFERENCE TO RELATED APPLICATIONS

This application claims the benefit of priority to Japanese Patent Application No. 2019-150855 filed on Aug. 21, 2019. The entire contents of this application are hereby incorporated herein by reference.

BACKGROUND OF THE INVENTION

1. Field of the Invention

The present invention relates to a multiplexer.

2. Description of the Related Art

Mobile communication apparatuses, such as cellular phones, are required to support carrier aggregation in which signals in a plurality of different frequency bands are simultaneously transmitted and received. For carrier aggregation, a multiplexer for, for example, separating reception signals received by a single antenna on the basis of frequency bands is connected to the antenna. For example, International Publication No. 2018/030277 discloses a multiplexer including a band pass filter for passing a signal in a predetermined frequency band and a band elimination filter for attenuating a signal in a predetermined frequency band.

In such a multiplexer including a plurality of filters, the characteristics of one filter sometimes affect the characteristics of another one of the filters and degrades the transmission characteristics of the filter. However, International Publication No. 2018/030277 does not take such a point into consideration. Accordingly, the transmission characteristics of the band pass filter may degrade depending on, for example, the design of a resonator included in the band elimination filter.

SUMMARY OF THE INVENTION

Preferred embodiments of the present invention provide multiplexers with each of which the degradation in the transmission characteristics of a band pass filter is able to be reduced or prevented.

A multiplexer according to a preferred embodiment of the present invention includes a band pass filter configured to pass a signal in a predetermined frequency band between a first terminal and a common terminal connected to an antenna and a band elimination filter that is configured to attenuate a signal in the predetermined frequency band between a second terminal and the common terminal and includes a plurality of resonators connected in series with a line between the second terminal and the common terminal. The resonators include a first resonator having the lowest resonant frequency and a second resonator disposed on a side of the common terminal from the first resonator.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
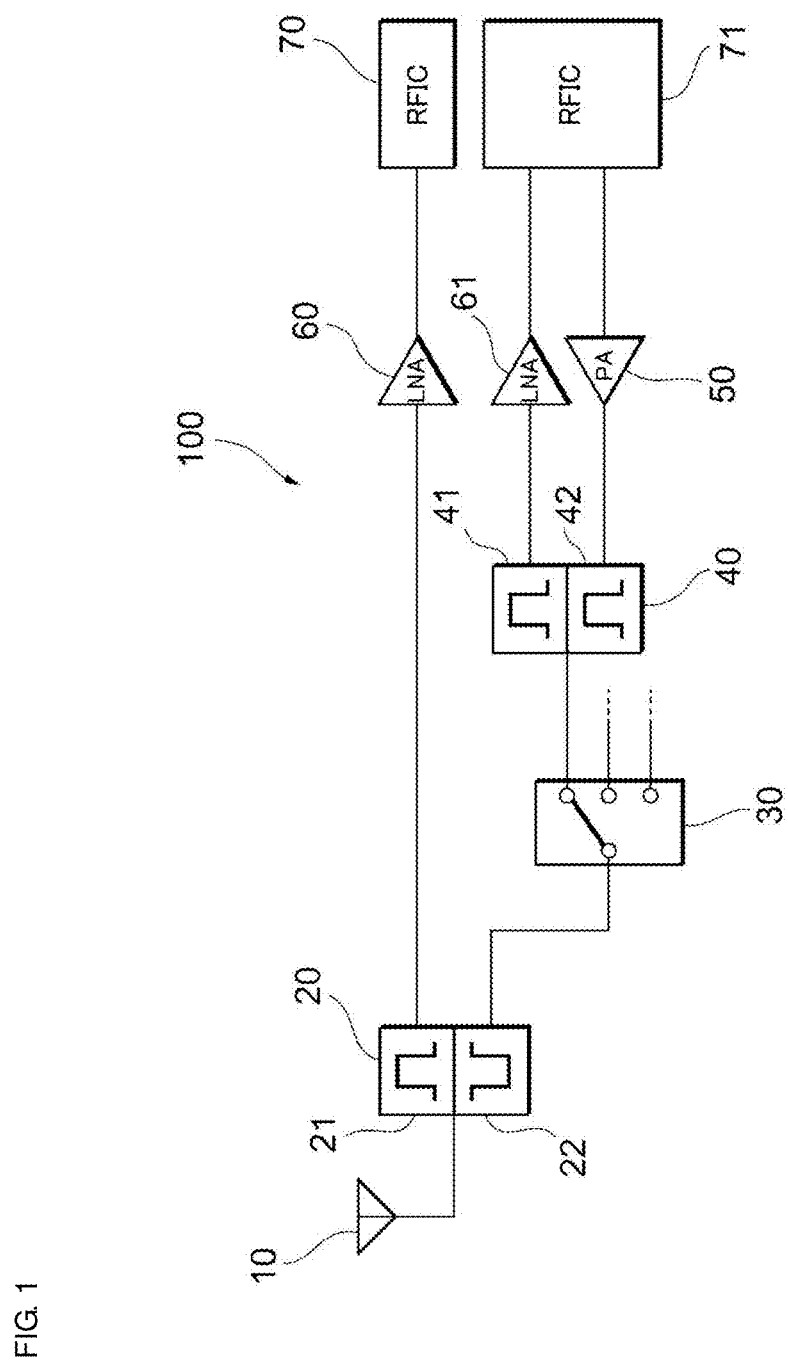
FIG. 1 is a diagram illustrating an exemplary configuration of a communication device including a multiplexer according to a preferred embodiment of the present invention.

Preferred embodiments of the present invention will be described in detail below with reference to the accompanying drawings. The same reference numerals are used to represent the same components or the same portion to avoid repeated explanation.

FIG. 1 is a diagram illustrating an exemplary configuration of a communication device including a multiplexer according to a preferred embodiment of the present invention. A communication device according to the present preferred embodiment is installed into a mobile communication apparatus, such as a cellular phone and performs the transmission/reception of a signal.

As illustrated in FIG. 1, a communication device 100 includes, for example, an antenna 10, a multiplexer 20, a switch 30, a duplexer 40, a power amplifier 50, low-noise amplifiers 60 and 61, and radio frequency integrated circuits (RFICs) 70 and 71.

The antenna 10 transmits/receives a radio frequency (RF) signal to/from a base station and receives a signal from a global positioning system (GPS).

The multiplexer 20 separates transmission signals to be transmitted from the antenna 10 and reception signals received by the antenna 10 in accordance with frequencies. The multiplexer 20 includes a band pass filter 21 and a band elimination filter 22. The band pass filter 21 passes signals of a predetermined frequency and attenuates signals of frequencies other than the predetermined frequency. The band elimination filter 22 attenuates signals of a predetermined frequency and passes signals of frequencies other than the predetermined frequency.

In the present preferred embodiment, a pass band that is a frequency band in which the band pass filter 21 passes signals and an attenuation band that is a frequency band in which the band elimination filter 22 attenuates signals overlap each other. For example, when there is a need to extract a GPS reception signal from various signals received by the antenna 10, the pass band of the band pass filter 21 and the attenuation band of the band elimination filter 22 are set to the frequency of the GPS reception signal. In this case, the GPS reception signal passes through the band pass filter 21 and reception signals other than the GPS reception signal pass through the band elimination filter 22. Thus, the multiplexer 20 can extract a signal of a specific frequency from signals of various frequencies. The type of a signal to be extracted is not limited to GPS.

A reception signal that has passed through the band pass filter 21 is supplied to the low-noise amplifier 60. A reception signal that has passed through the band elimination filter 22 is supplied to the switch 30. A transmission signal is supplied from the switch 30 to the band elimination filter 22. The configuration of the multiplexer 20 will be described in detail below.

The switch 30 supplies a reception signal supplied from the band elimination filter 22 to any one of duplexers based on a communication standard and a frequency band. Although the duplexer 40 is illustrated in FIG. 1 as an example, a plurality of duplexers may be connected to the switch 30 or a multiplexer and a receiver may be connected to the switch 30, instead of duplexers. The switch 30 supplies transmission signals supplied from respective duplexers to the band elimination filter 22. The communication device 100 does not necessarily have to include the switch 30.

The duplexer 40 separates a reception signal supplied from the switch 30 and a transmission signal supplied from the power amplifier 50 in accordance with frequencies. The duplexer 40 includes, for example, two band pass filters 41 and 42. The band pass filter 41 passes a signal in a reception frequency band. The band pass filter 42 passes a signal in a transmission frequency band. Accordingly, the leakage of one of a transmission signal and a reception signal in the other one of them is reduced or prevented.

The power amplifier 50 amplifies the power of a transmission signal generated by the RFIC 71 and supplies a resultant signal to the duplexer 40.

The low-noise amplifier 60 amplifies the power of a reception signal supplied from the multiplexer 20 and supplies a resultant signal to the RFIC 70.

The low-noise amplifier 61 amplifies the power of a reception signal supplied from the duplexer 40 and supplies a resultant signal to the RFIC 71.

The RFIC 70 is an integrated circuit to process a predetermined signal (e.g., a GPS reception signal) extracted by the multiplexer 20. The RFIC 71 is an integrated circuit to process a signal other than the predetermined signal, that is, a signal in the pass band of the band elimination filter 22 (e.g., the reception signal of a cellular phone). Although the case is illustrated in FIG. 1 where the RFICs 70 and 71 are separate ICs, portions or all of the functions of the RFICs 70 and 71 may be provided by a single chip.

The above-described components in the communication device 100 may be provided in the same chip as a module or in separate chips. The communication device 100 does not necessarily have to include, for example, the antenna 10. In this case, the antenna 10 may be connected to the communication device 100. Next, the configuration of the multiplexer 20 will be described in more detail below.

Figure 2:
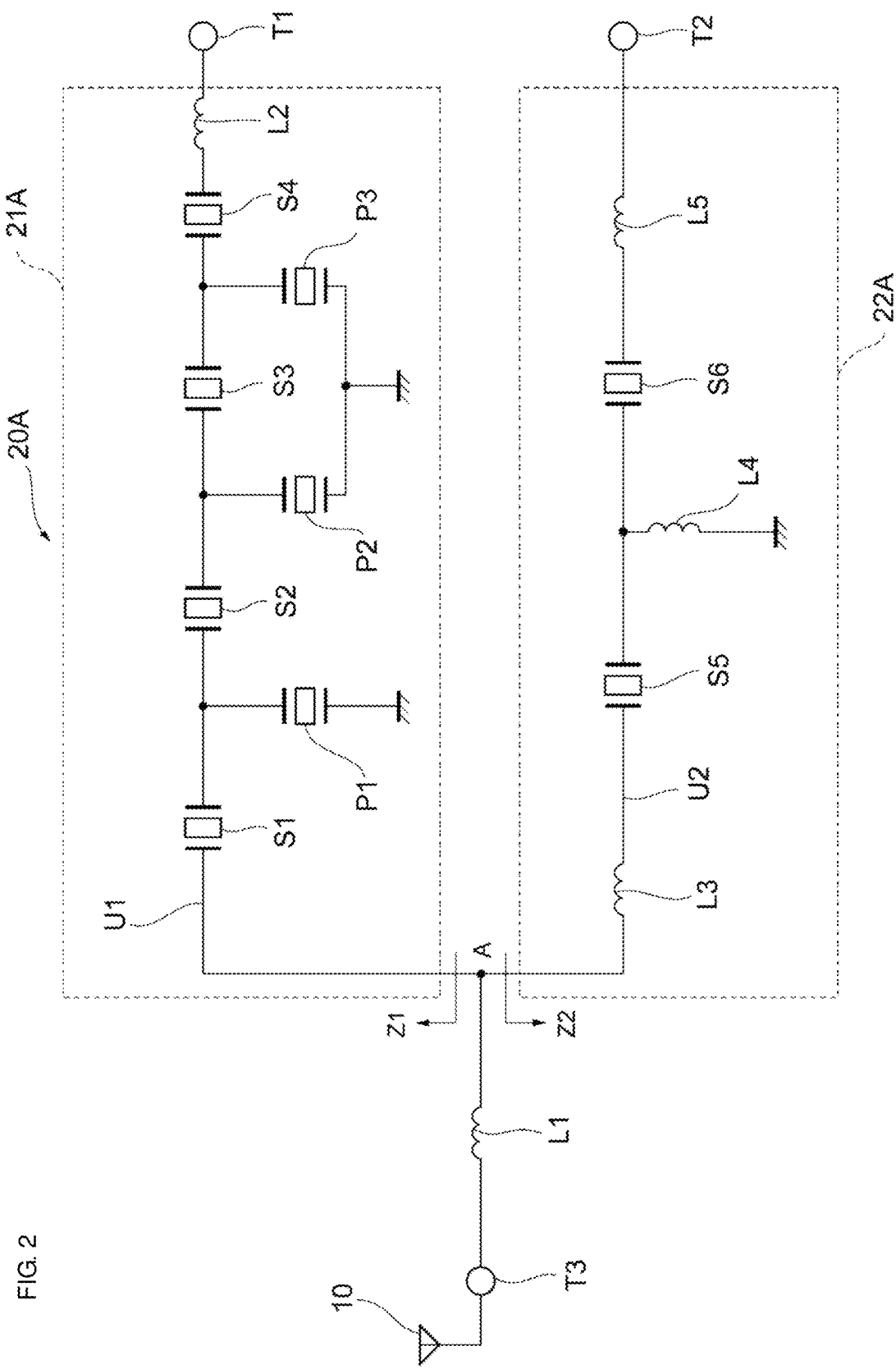
FIG. 2 is a diagram illustrating an exemplary configuration of a multiplexer according to a preferred embodiment of the present invention and associated components.

FIG. 2 is a diagram illustrating an exemplary configuration of a multiplexer according to a preferred embodiment of the present invention and associated components.

As illustrated in FIG. 2, a multiplexer 20A according to the present preferred embodiment includes a band pass filter 21A and a band elimination filter 22A. The band pass filter 21A outputs from a terminal T1 (a first terminal) a reception signal supplied from the antenna 10 via a common terminal T3. The band elimination filter 22A outputs from a terminal T2 (second terminal) a reception signal supplied from the antenna 10 via the common terminal T3 and outputs from the common terminal T3 a transmission signal supplied from the switch 30 via the terminal T2. Although the band pass filter 21A passes a reception signal in the present preferred embodiment, it may pass a transmission signal, instead of or in addition to a reception signal.

The band pass filter 21A is preferably a ladder filter, for example, in which a plurality of resonators are disposed at series and parallel arms. For example, the band pass filter 21A preferably includes four resonators S1 to S4, three resonators P1 to P3, and an inductor L2. The numbers of resonators and inductors are merely examples and are not limited to the above-described numbers.

Components defining the resonators S1 to S4 and the resonators P1 to P3 are not particularly limited, and may be, for example, surface acoustic wave (SAW) filters, filters such as piezoelectric thin film resonators, or bulk acoustic wave (BAW) filters. The same can be said for the resonators S5 and S6 to be described below.

The four resonators S1 (third resonator) to S4 are connected in series with each other in order of increasing distance from the antenna 10 on a line U1 connecting the common terminal T3 and the terminal T1. The three resonators P1 (fourth resonator) to P3 are connected in parallel with each other such that they branch off from the line U1 in order of increasing distance from the antenna 10. One ends of the three resonators P1 to P3 are connected to the node between the resonators S1 and S2, the node between the resonators S2 and S3, and the node between the resonators S3 and S4, respectively. A reference potential (e.g., a ground potential) is supplied to the other ends of the three resonators P1 to P3.

Between the resonator S4 and the terminal T1, the inductor L2 (fourth inductor) is connected in series with the resonator disposed at the series arm.

The band elimination filter 22A includes a plurality of resonators that are connected in series with each other. Specifically, the band elimination filter 22A includes the two resonators S5 and S6 and three inductors L3 to L5. The numbers of the resonators and inductors are merely examples and are not limited to the above-described numbers.

The resonator S5 (a second resonator and a sixth resonator) and the resonator S6 (a first resonator and a fifth resonator) are adjacently connected in series with each other in order of increasing distance from the antenna 10 on a line U2 connecting the common terminal T3 and the terminal T2.

Between the common terminal T3 and the resonator S5, the inductor L3 (a second inductor) is connected in series with the resonator S5. One end of the inductor L4 is connected to the node between the resonator S5 and the resonator S6 such that it branches off from the line U2. A reference potential (e.g., a ground potential) is supplied to the other end of the inductor L4. Between the resonator S6 and the terminal T2, the inductor L5 (a third inductor) is connected in series with the resonator S6.

An inductor L1 (a fifth inductor) is connected in series with a line between the common terminal T3 and a node A between the band pass filter 21A and the band elimination filter 22A.

In the present preferred embodiment, the pass band and the pass band width of the band pass filter 21A and the attenuation band and the attenuation band width of the band elimination filter 22A are preferably the same or substantially the same. Accordingly, the resonators included in the respective filters satisfy the resonant frequency condition and the anti-resonant frequency condition illustrated in FIG. 3.

Figure 3:
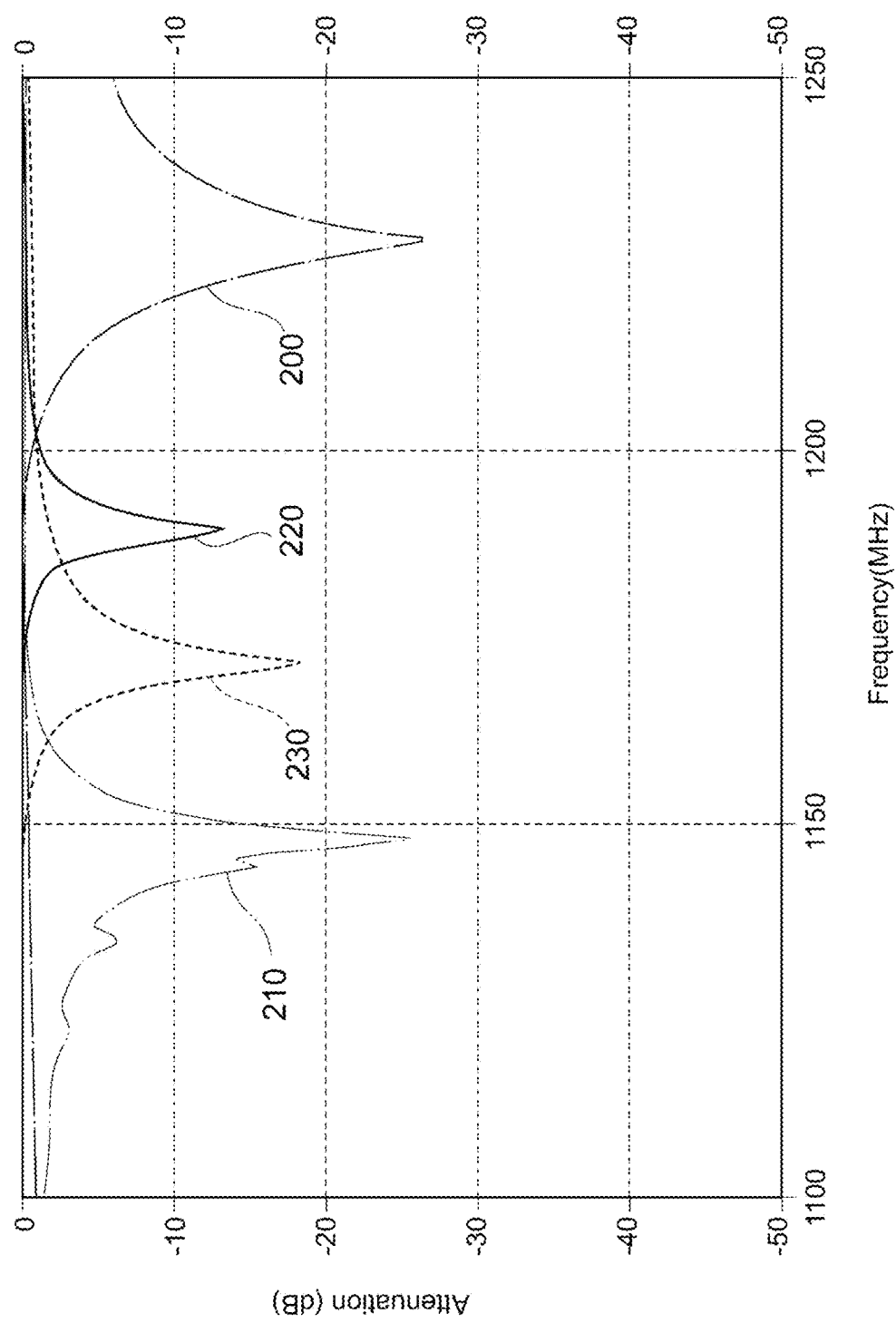
FIG. 3 is a graph representing simulation results of attenuation characteristics of each resonator included in a band pass filter and a band elimination filter.

FIG. 3 is a graph representing simulation results of attenuation characteristics of each resonator included in the band pass filter and the band elimination filter illustrated in FIG. 2. In the graph illustrated in FIG. 3, the horizontal axis represents frequency (MHz) and the vertical axis represents signal attenuation (dB). Characteristics 200 are the attenuation characteristics of the resonator S1 in the band pass filter 21A. Characteristics 210 are the attenuation characteristics of the resonator P1 in the band pass filter 21A. Characteristics 220 are the attenuation characteristics of the resonator S5 in the band elimination filter 22A. The characteristics 230 are the attenuation characteristics of the resonator S6 in the band elimination filter 22A.

Since the resonators S1, S5, and S6 are disposed at the series arms, signals are heavily attenuated at the anti-resonant frequencies thereof as illustrated in FIG. 3. Since the resonator P1 is disposed at the parallel arm, signals are heavily attenuated at the resonant frequency thereof. In the present preferred embodiment, the anti-resonant frequencies of the resonators S5 and S6 in the band elimination filter 22A are located between the anti-resonant frequency of the resonator S1 in the band pass filter 21A and the resonant frequency of the resonator P1. The pass band of the band pass filter 21A and the attenuation band of the band elimination filter 22A therefore overlap one another. Although the resonators S1 and P1 are selected as examples of the resonators in the band pass filter 21A in FIG. 3, the anti-resonant frequencies of the resonators in the band elimination filter 22A may be higher than the resonant frequency of any one of the resonators at the parallel arm in the band pass filter 21A and lower than the anti-resonant frequency of any one of the resonators at the series arm in the band pass filter 21A.

In a multiplexer including a plurality of filters, the characteristics of one of the filters sometimes affect the characteristics of another one of the filters and degrade the transmission characteristics of the filter. Accordingly, the transmission characteristics of a band pass filter may be degraded depending on, for example, the design of a resonator in a band elimination filter.

In the present preferred embodiment, the resonant frequency of the resonator S5 on the side of the common terminal T3, which is one of the resonators in the band elimination filter 22A, is preferably set to be higher than that of the resonator S6 on the side of the terminal T2. For example, a resonant frequency $f_r$ of a SAW filter is represented by $f_r = v/\lambda$ [Hz] where $\lambda$ represents the period of an interdigital transducer (IDT) and v represents an acoustic velocity at a piezoelectric substrate in the SAW filter. Accordingly, when a resonator is a SAW filter, the desired resonant frequency $f_r$ can be obtained by adjusting the period of an IDT.

It is assumed that an impedance on the side of the band pass filter 21A is Z1 and an impedance on the side of the band elimination filter 22A is Z2 when viewed from the node A between the band pass filter 21A and the band elimination filter 22A. In general, the impedance Z1 in the pass band of the band pass filter 21A is, for example, 50Ω and the impedance Z2 in the attenuation band of the band elimination filter 22A is set to be high. When the impedance Z2 is low, the leakage of a signal to the side of the band elimination filter 22A easily occurs. Accordingly, the transmission characteristics of the band pass filter 21A may degrade and the insertion loss of the band pass filter 21A may be high.

In the present preferred embodiment, since the resonant frequency of the resonator S5 is higher than that of the resonator S6, the impedance Z2 in the pass band of the band pass filter 21A is high. Accordingly, the leakage of a signal to the side of the band elimination filter 22A is reduced or prevented and the flow of a signal to the side of the band pass filter 21A is increased. This can reduce or prevent the degradation in the transmission characteristics of the band pass filter 21A.

A resonator has a predetermined electrostatic capacitance. In the band elimination filter 22A, it is preferable that the capacitance value of the resonator S5 is smaller than that of the resonator S6. In this case, the impedance Z2 in the pass band of the band pass filter 21A becomes higher. This can reduce or prevent the degradation in the transmission characteristics of the band pass filter 21A.

FIGS. 4A to 4D are graphs each representing simulation results of bandpass characteristics of a band pass filter when the condition of the resonant frequencies and capacitance values of the resonators in the band elimination filter illustrated in FIG. 2 is changed. Specifically, in this simulation, the resonant frequency level relationship between the resonators S5 and S6 and the capacitance value magnitude relationship between the resonators S5 and S6 are changed. The following Table 1 indicates the resonant frequency relationship and capacitance value relationship of the resonator S5 with the resonator S6.

TABLE 1

Figure 4A:
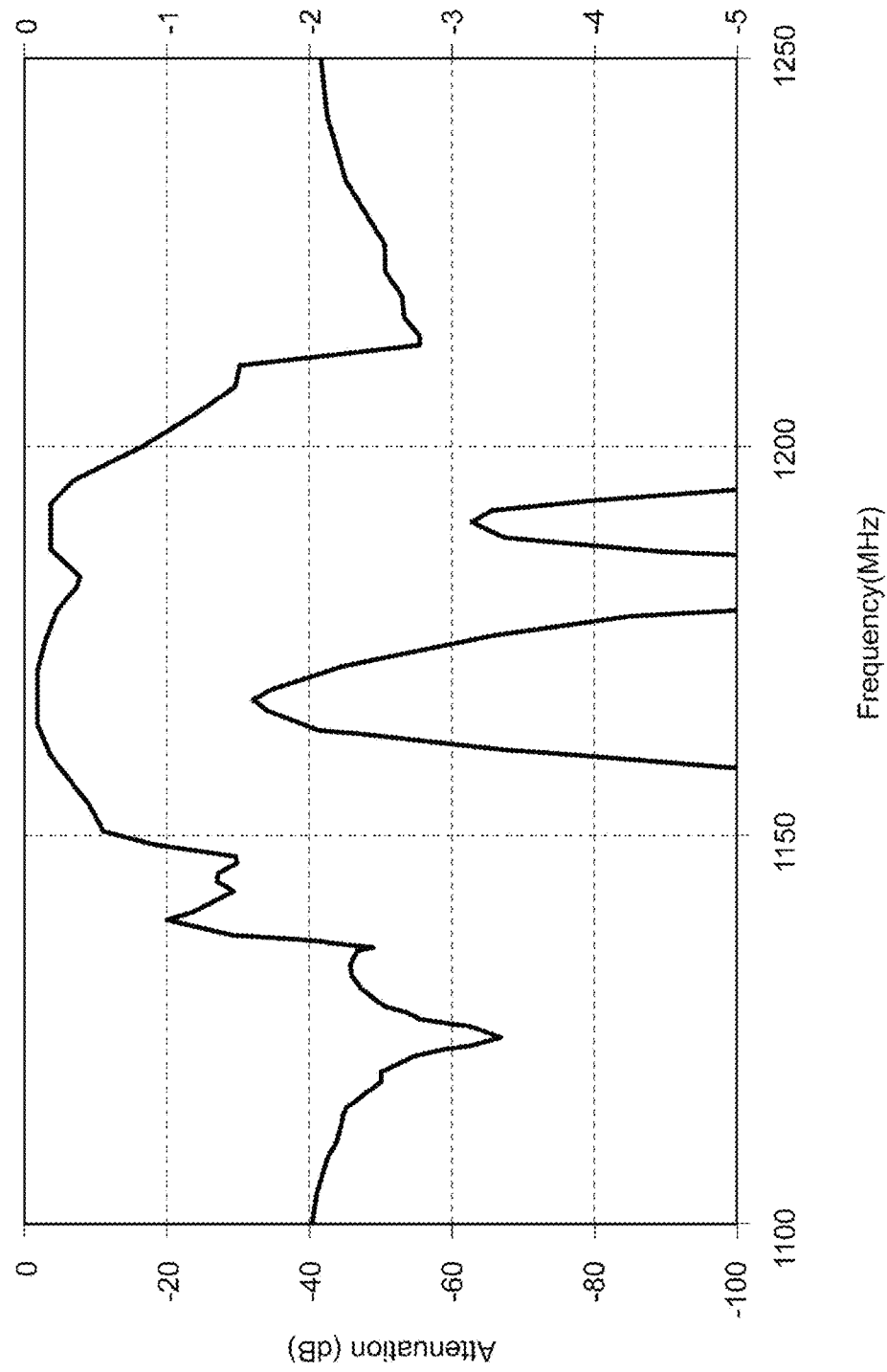
FIG. 4A is a graph representing simulation results of bandpass characteristics of a band pass filter when the condition of the resonant frequencies and capacitance values of resonators in a band elimination filter is changed.
Figure 4B:
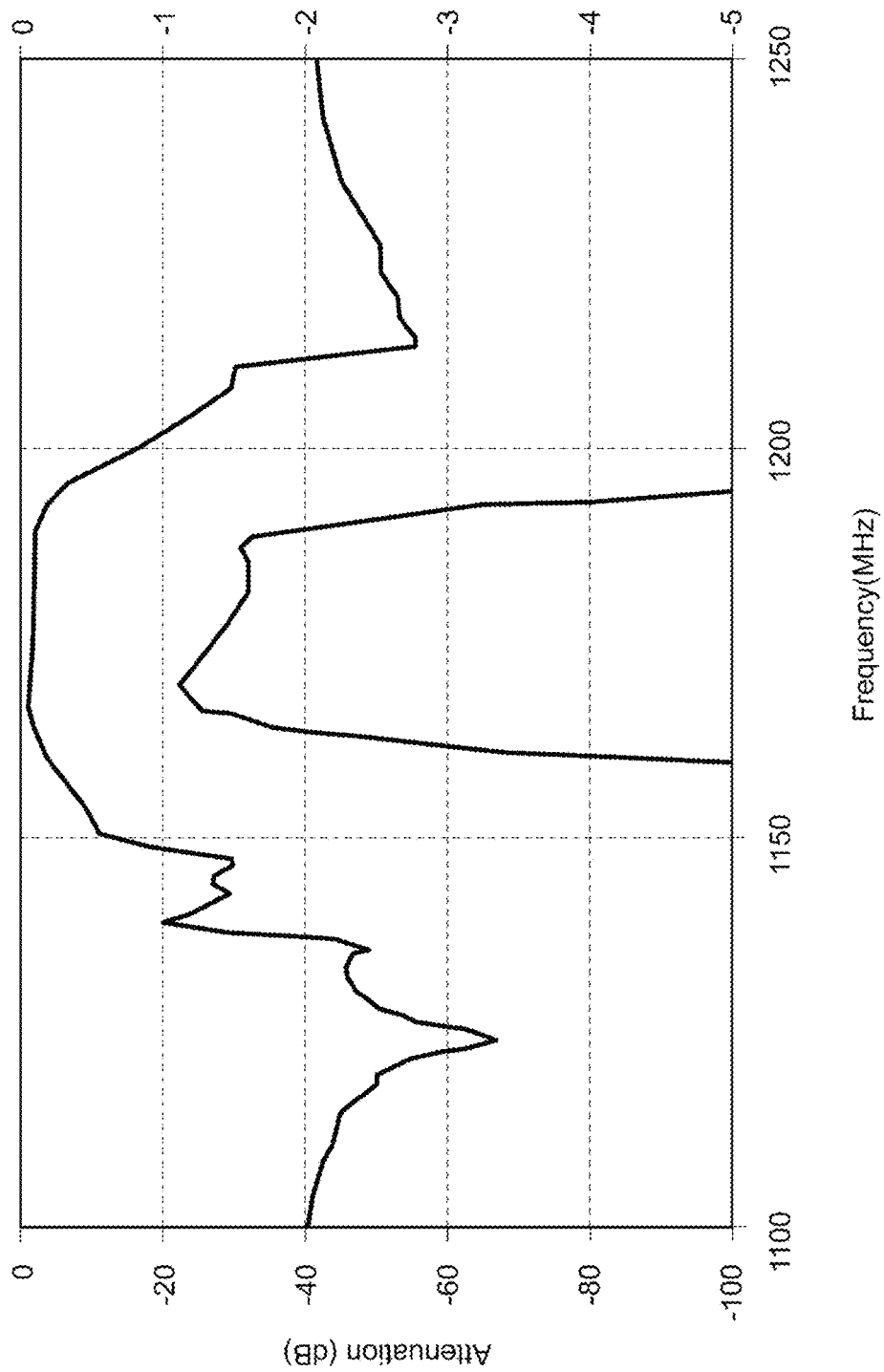
FIG. 4B is a graph representing simulation results of bandpass characteristics of a band pass filter when the condition of the resonant frequencies and capacitance values of resonators in a band elimination filter is changed.
Figure 4C:
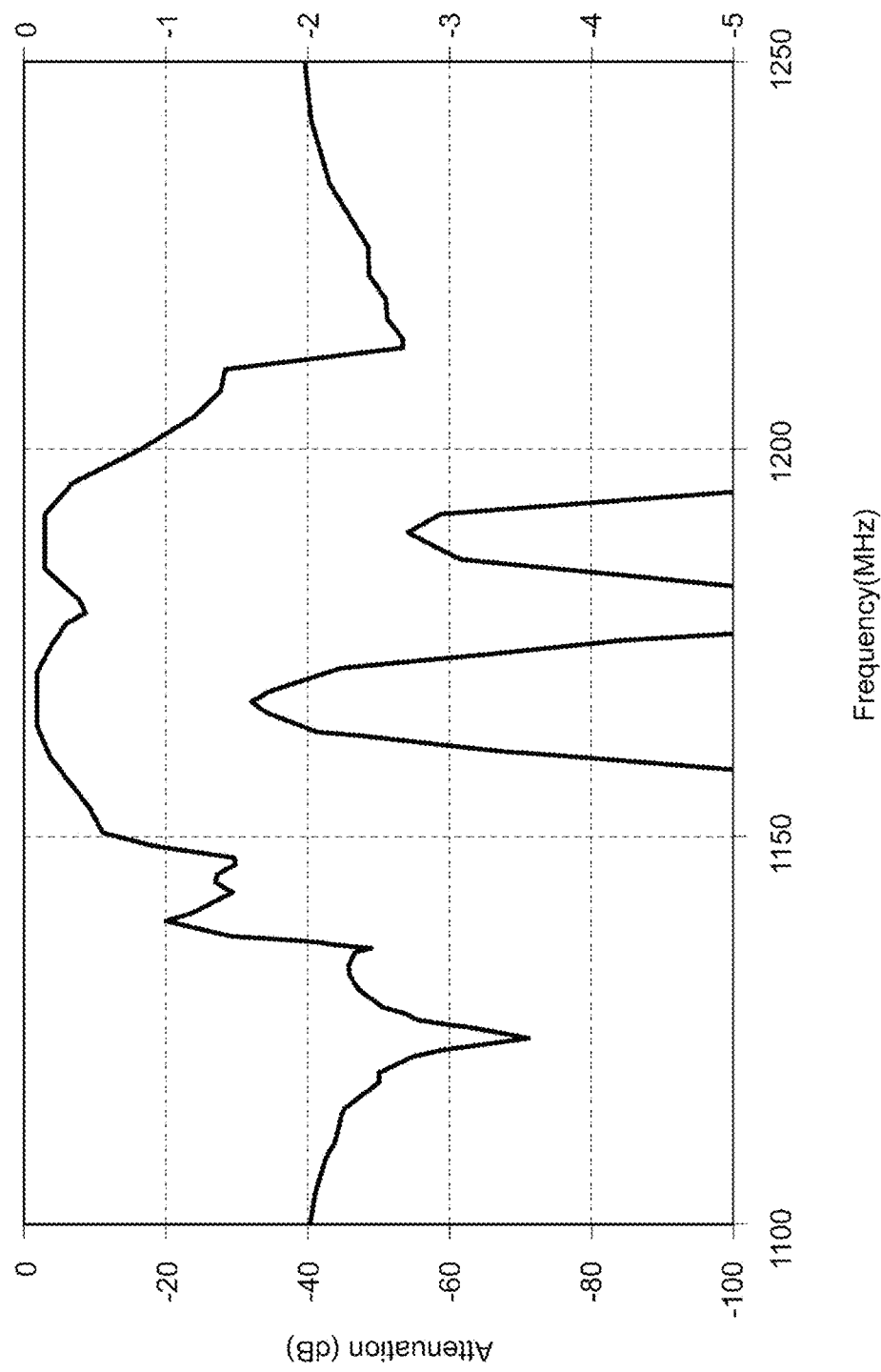
FIG. 4C is a graph representing simulation results of bandpass characteristics of a band pass filter when the condition of the resonant frequencies and capacitance values of resonators in a band elimination filter is changed.
Figure 4D:
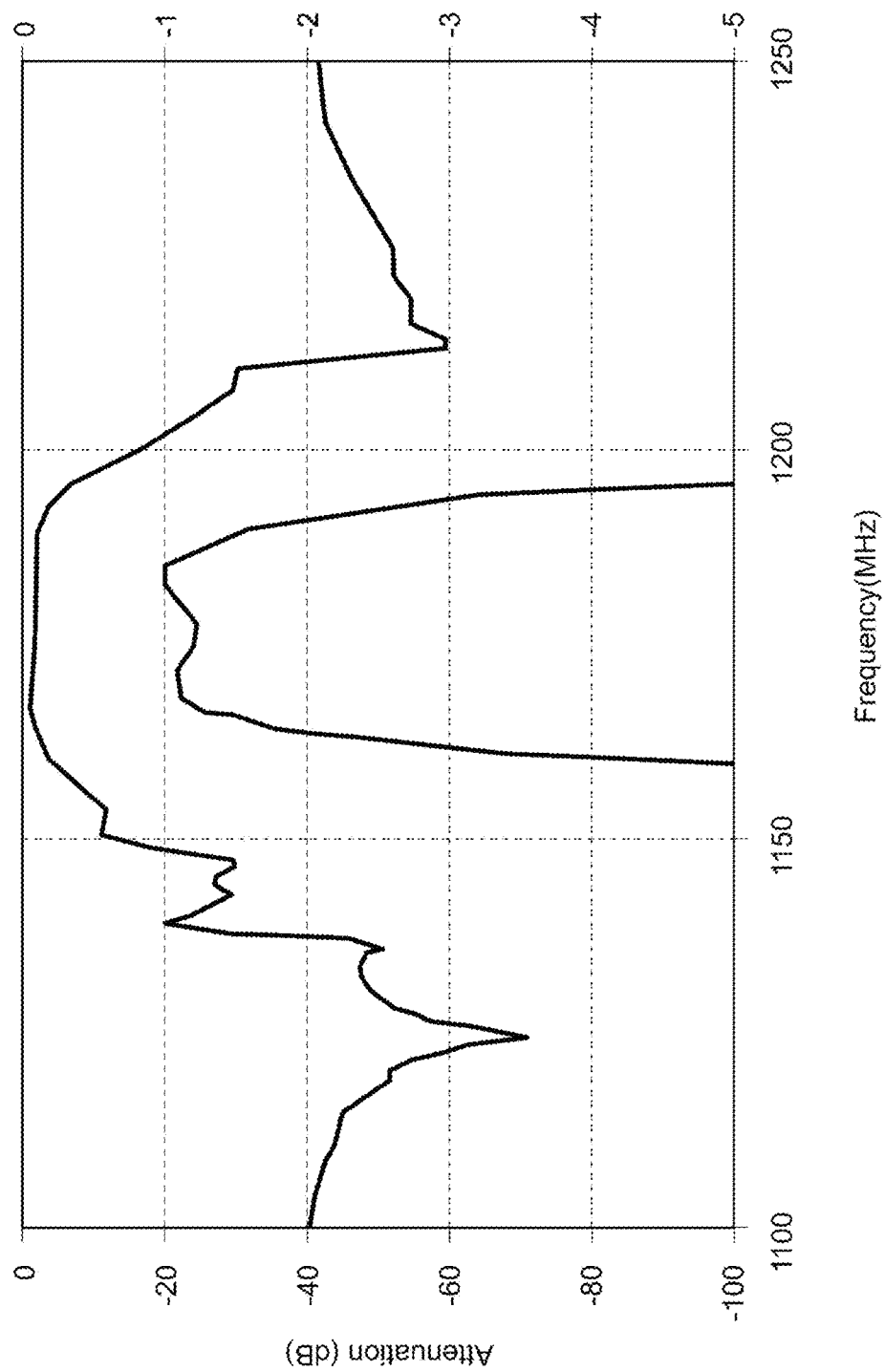
FIG. 4D is a graph representing simulation results of bandpass characteristics of a band pass filter when the condition of the resonant frequencies and capacitance values of resonators in a band elimination filter is changed.

| Capacitance Value | Resonant Frequency | |
| --- | --- | --- |
|  | Low (S5 < S6) | High (S5 > S6) |
| Large (S5 > S6) | FIG. 4A | FIG. 4B |
| Small (S5 < S6) | FIG. 4C | FIG. 4D |

In this simulation, the band pass filter 21A is set to have, for example, the pass band of about 1166.22 MHz to about 1186.68 MHz. In each of FIGS. 4A to 4D, the horizontal axis represents signal frequency (MHz) and the vertical axis represents signal attenuation (dB). In each of FIGS. 4A to 4D, the upper graph represents bandpass characteristics in units of 10 dB (see scales of the vertical axis on the left side) and the lower graph represents bandpass characteristics in units of 1 dB (see scales of the vertical axis on the right side).

As is apparent from the comparison between FIGS. 4A and 4B, the transmission characteristics of a band pass filter are significantly improved when the resonant frequency of the resonator S5 is higher than that of the resonator S6. Referring to FIG. 4B, a signal attenuation uniformly falls within the range of −2 dB to −1 dB in the pass band. Similarly, as is apparent from the comparison between FIGS. 4C and 4D, the transmission characteristics of a band pass filter are significantly improved when the resonant frequency of the resonator S5 is higher than that of the resonator S6.

As is apparent from the comparison between FIGS. 4B and 4D, the transmission characteristics of a band pass filter on the higher frequency side are slightly improved when the capacitance value of the resonator S5 is smaller than that of the resonator S6. Similarly, as is apparent from the comparison between FIGS. 4A and 4C, the transmission characteristics of a band pass filter on the higher frequency side are slightly improved when the capacitance value of the resonator S5 is smaller than that of the resonator S6.

Based on the above simulation results, it can be said that the resonant frequency of the resonator S5 is preferably higher than that of the resonator S6 regardless of the capacitance value magnitude relationship between the resonators S5 and S6. It can also be said that the capacitance value of the resonator S5 is preferably smaller than that of the resonator S6 regardless of the resonant frequency level relationship between the resonators S5 and S6. It can be said that the resonant frequency level relationship contributes more significantly to the improvement of bandpass characteristics of a band pass filter as compared with the capacitance value magnitude relationship.

Although the band elimination filter 22A includes the two resonators S5 and S6 in the above preferred embodiment, the number of resonators included in a band elimination filter may be three or more, for example. When a band elimination filter includes three or more resonators, at least one resonator may be provided on the side of the common terminal T3 from the resonator having the lowest resonant frequency. In addition, at least one resonator may be provided on the side of the common terminal T3 from the resonator having the largest capacitance value.

Although a single resonator is provided on both sides of the inductor L4 in the band elimination filter 22A in the above preferred embodiment, either or both of the resonators S5 and S6 may be divided. The division of a resonator means that a plurality of series-connected resonators are provided, instead of a single resonator, and the combined characteristics of the resonators coincide with those of a single resonator before the division. When either or both of the resonators S5 and S6 is divided, it is preferable that all of the divided resonators satisfy the above resonant frequency level relationship. In addition, it is preferable that the combined capacitance value of a plurality of divided resonators satisfy the above capacitance value magnitude relationship.

Next, the inductor L4 in the band elimination filter 22A will be described. Since the band elimination filter 22A includes the inductor L4 between the resonators S5 and S6, the impedance Z2 in the pass band of the band pass filter 21A becomes high. This can also improve the transmission characteristics of the band pass filter 21A.

Figure 5A:
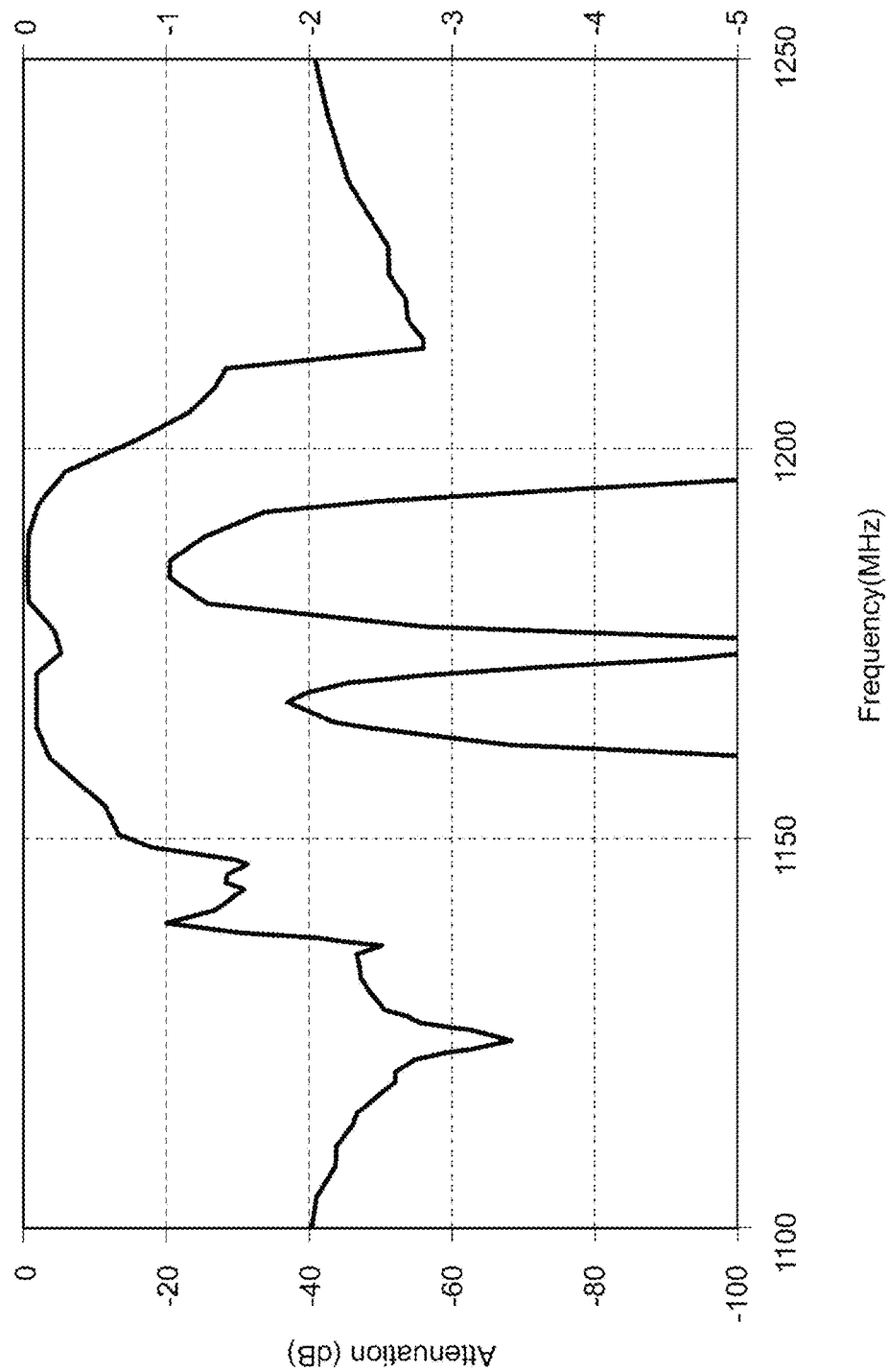
FIG. 5A is a graph representing simulation results of bandpass characteristics of a band pass filter when the condition of an inductor in a band elimination filter is changed.
Figure 5B:
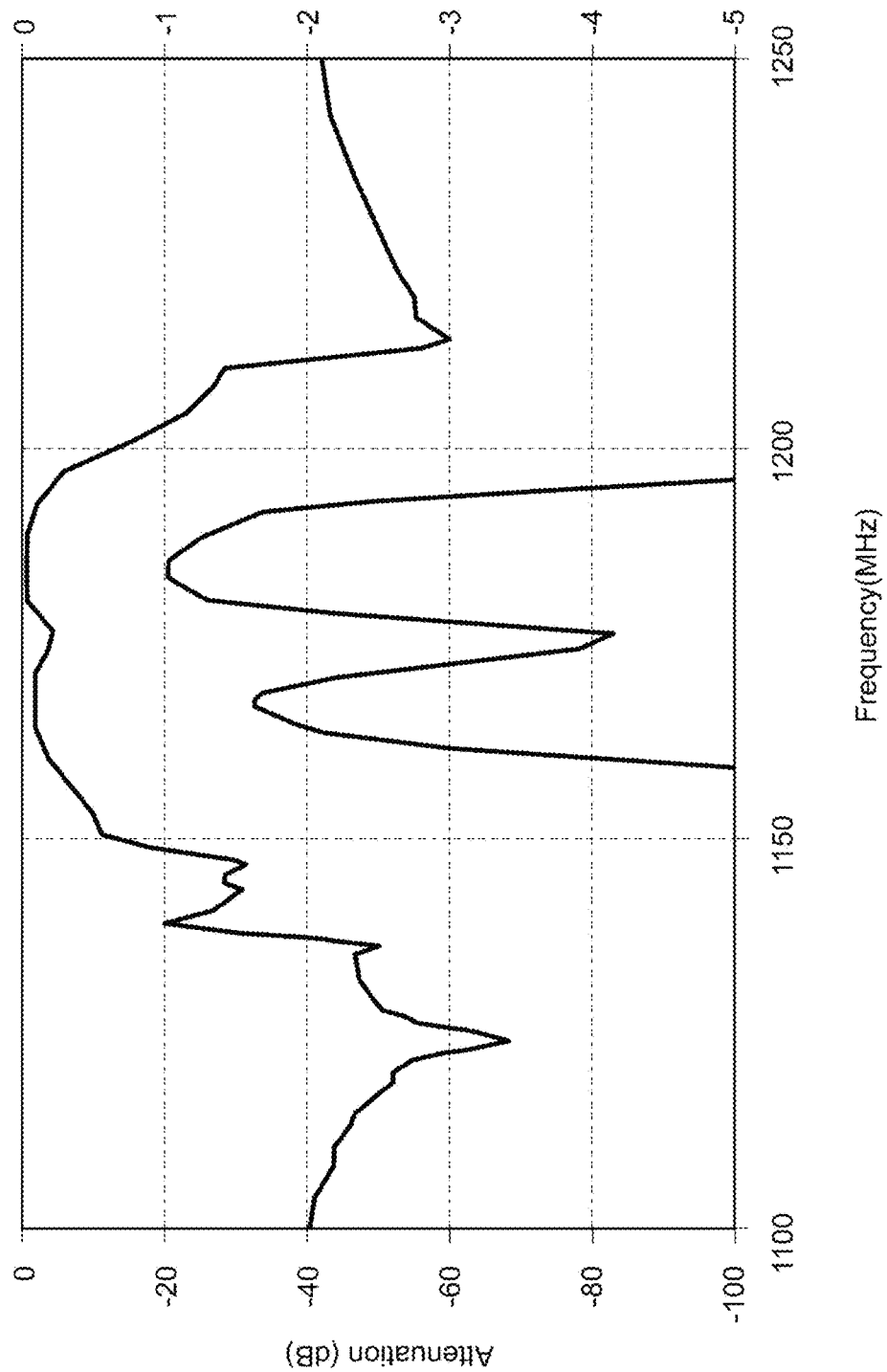
FIG. 5B is a graph representing simulation results of bandpass characteristics of a band pass filter when the condition of an inductor in a band elimination filter is changed.
Figure 5C:
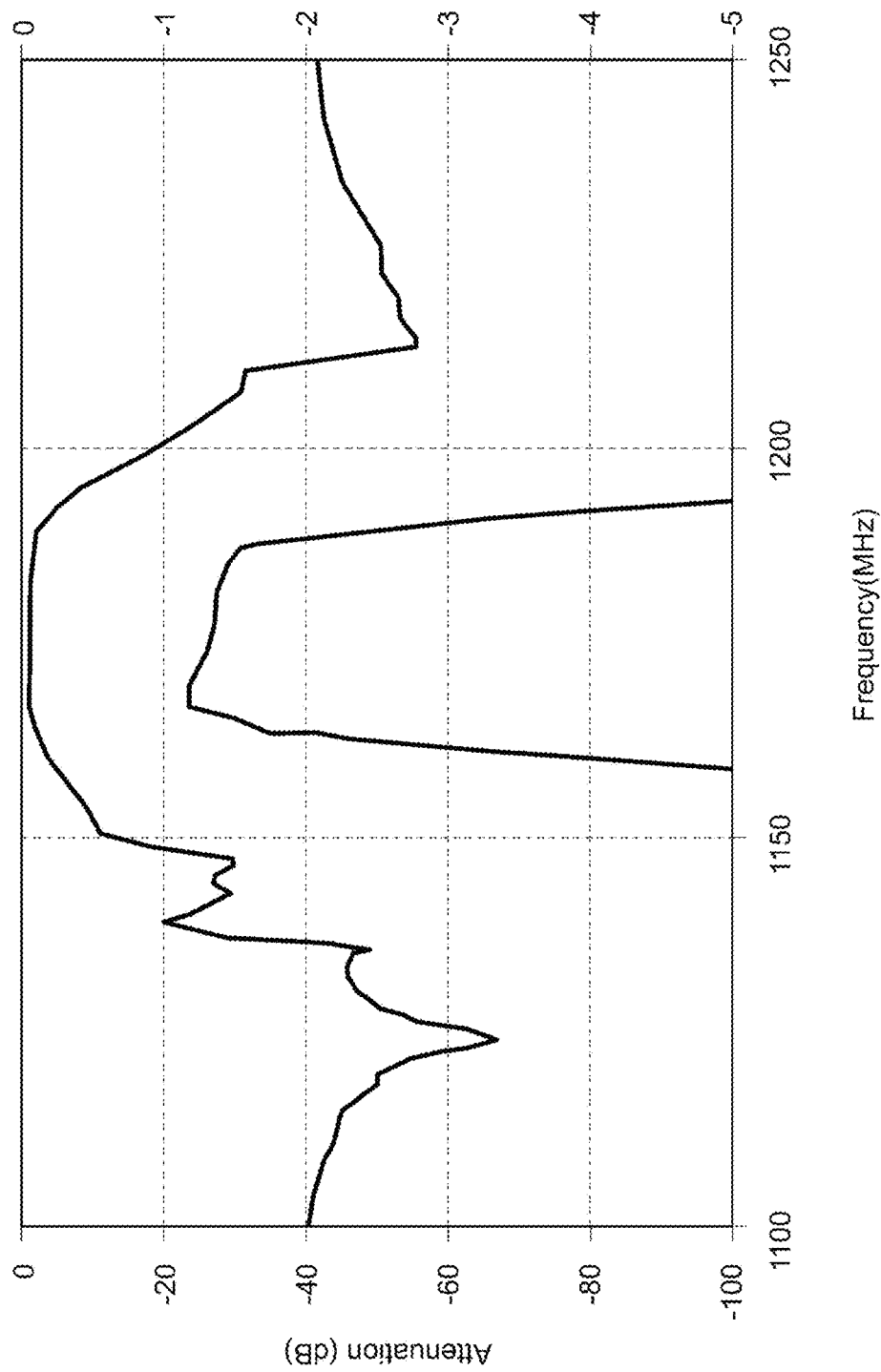
FIG. 5C is a graph representing simulation results of bandpass characteristics of a band pass filter when the condition of an inductor in a band elimination filter is changed.
Figure 5D:
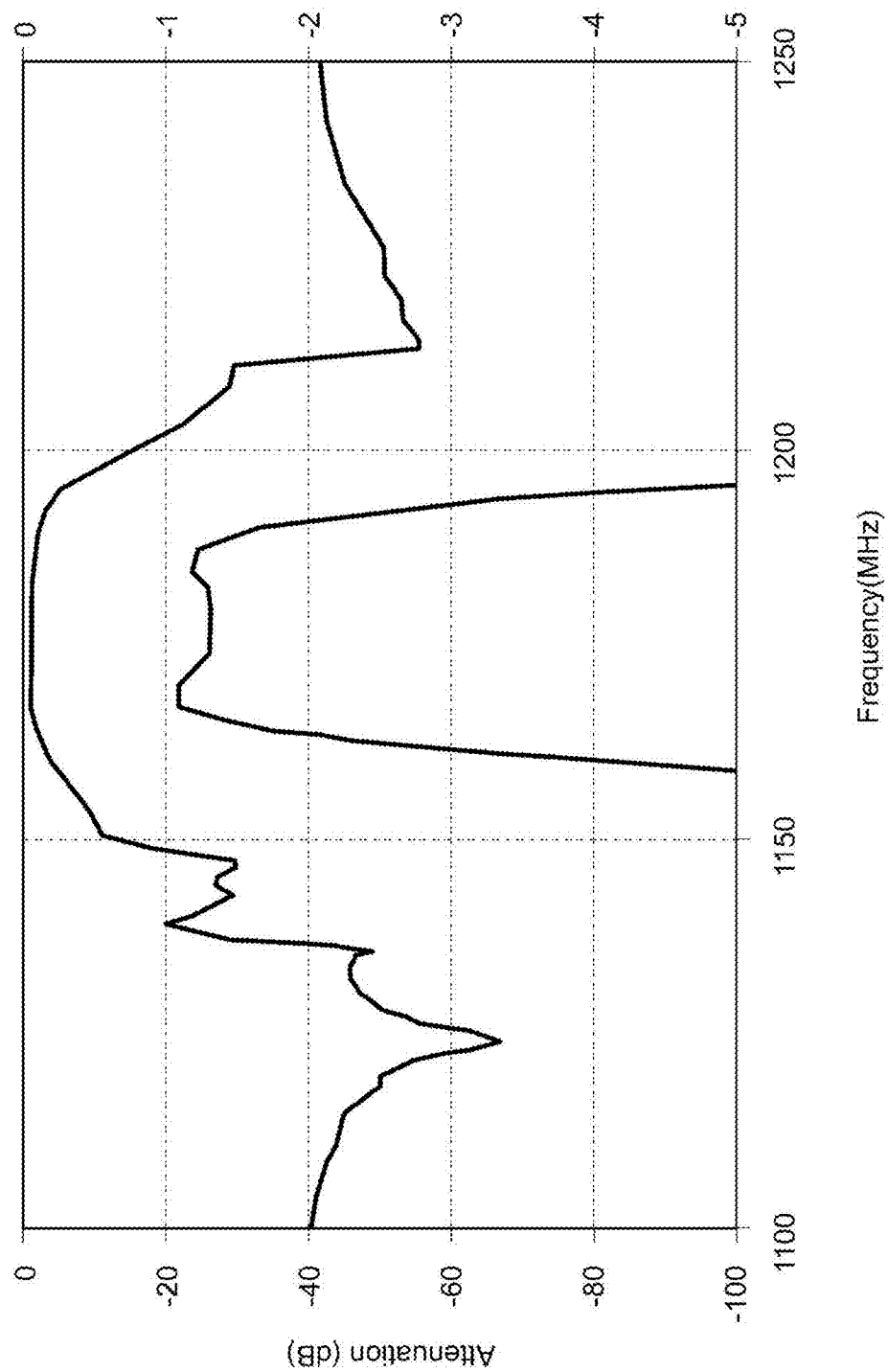
FIG. 5D is a graph representing simulation results of bandpass characteristics of a band pass filter when the condition of an inductor in a band elimination filter is changed.

FIGS. 5A to 5D are graphs each representing simulation results of bandpass characteristics of a band pass filter when the condition of the inductor L4 in the band elimination filter illustrated in FIG. 2 is changed. FIG. 5A illustrates a simulation result in the case of the configuration in which an inductor corresponding to the inductor L4 in the band elimination filter 22A is not provided. FIG. 5B illustrates a simulation result in the case of the configuration in which one end of an inductor corresponding to the inductor L4 in the band elimination filter 22A is not connected to the node between the resonators S5 and S6 but to the node between the resonator S6 and the inductor L5. FIG. 5C illustrates a simulation result in the case where the inductance value of the inductor L4 is smaller than that of the inductor L3 in the band elimination filter 22A. FIG. 5D illustrates a simulation result in the case where the inductance value of the inductor L4 is larger than that of the inductor L3 in the band elimination filter 22A.

The resonant frequency level relationship between the resonators S5 and S6 is that the resonant frequency of the resonator S5 is higher than that of the resonator S6. The capacitance value magnitude relationship between the resonators S5 and S6 is that the capacitance value of the resonator S5 is smaller than that of the resonator S6. The other conditions are the same or substantially the same as those described above with reference to FIGS. 4A to 4D, and the description thereof will be omitted.

As is apparent from the comparison between FIGS. 5A and 5B, the transmission characteristics of a band pass filter near the center frequency of the pass band thereof is slightly improved when a band elimination filter includes an inductor branched off from the line U2.

As is apparent from the comparison between FIGS. 5B and 5C, the transmission characteristics of the band pass filter 21 are more significantly improved in the case where the inductor branched off from the line U2 is located between the resonators S5 and S6 as compared with the case where the inductor is located at a stage subsequent to the resonator S6.

As is apparent from the comparison between FIGS. 5C and 5D, the transmission characteristics of the band pass filter 21 are further improved when the inductance value of the inductor L4 is larger than that of the inductor L3.

Based on the above simulation results, it can be said that the transmission characteristics of the band pass filter 21 are further improved when the inductor L4 having the inductance value larger than that of the inductor L3 is provided between the resonators S5 and S6 in the band elimination filter 22A according to the present preferred embodiment.

Figure 6:
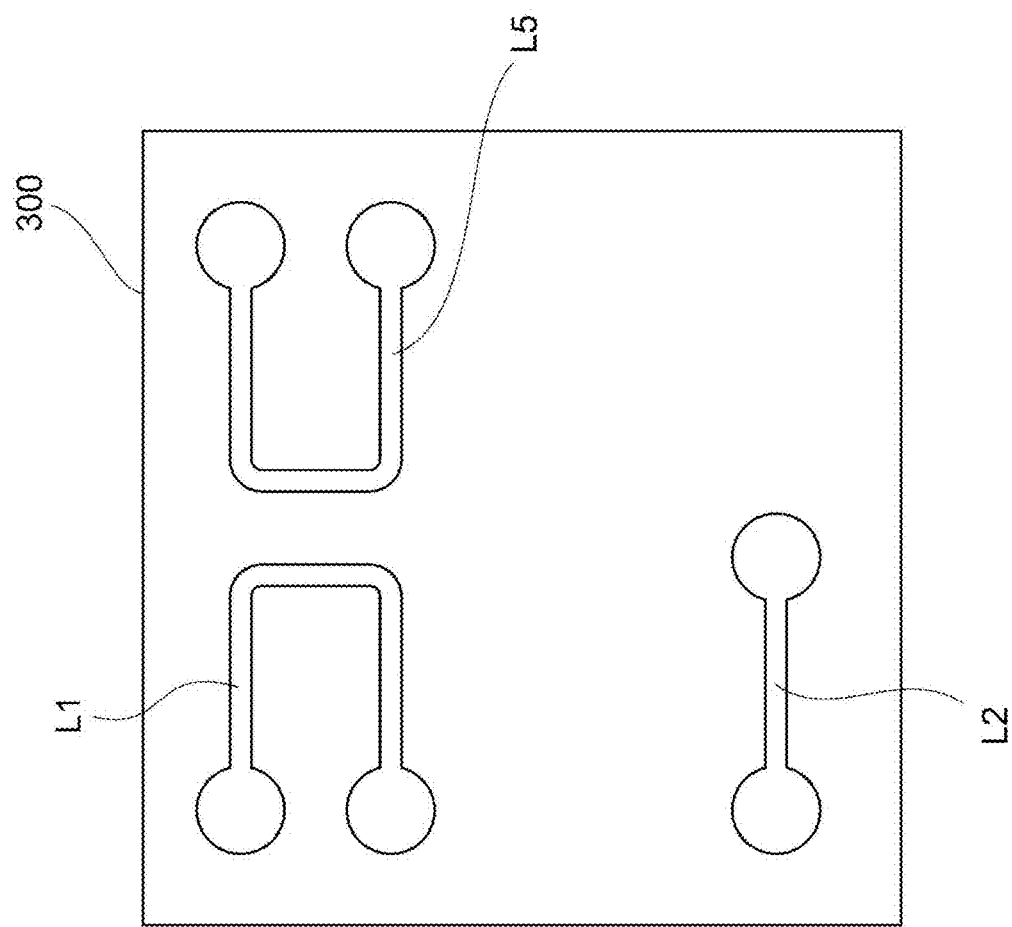
FIG. 6 is a diagram illustrating an example of the layout of the inductors illustrated in FIG. 2.

FIG. 6 is a diagram illustrating an example of the layout of the inductors illustrated in FIG. 2. In FIG. 6, only components related to the multiplexer 20A are illustrated and the illustration of the other components is omitted.

When the inductor in the band pass filter 21A and the inductors in the band elimination filter 22A are incorporated into a single package, it is preferable that the inductor L5 is nearer to the inductor L1 than to the inductor L2. In the example illustrated in FIG. 6, a portion of the inductor L1 and a portion of the inductor L5 are parallel or substantially parallel to each other on a substrate 300. Thus, by disposing the inductors L1 and L5 to be close to each other, both of them are coupled and mutual induction occurs. This leads to the improvement of the transmission characteristics of the band elimination filter 22A.

Figure 7A:
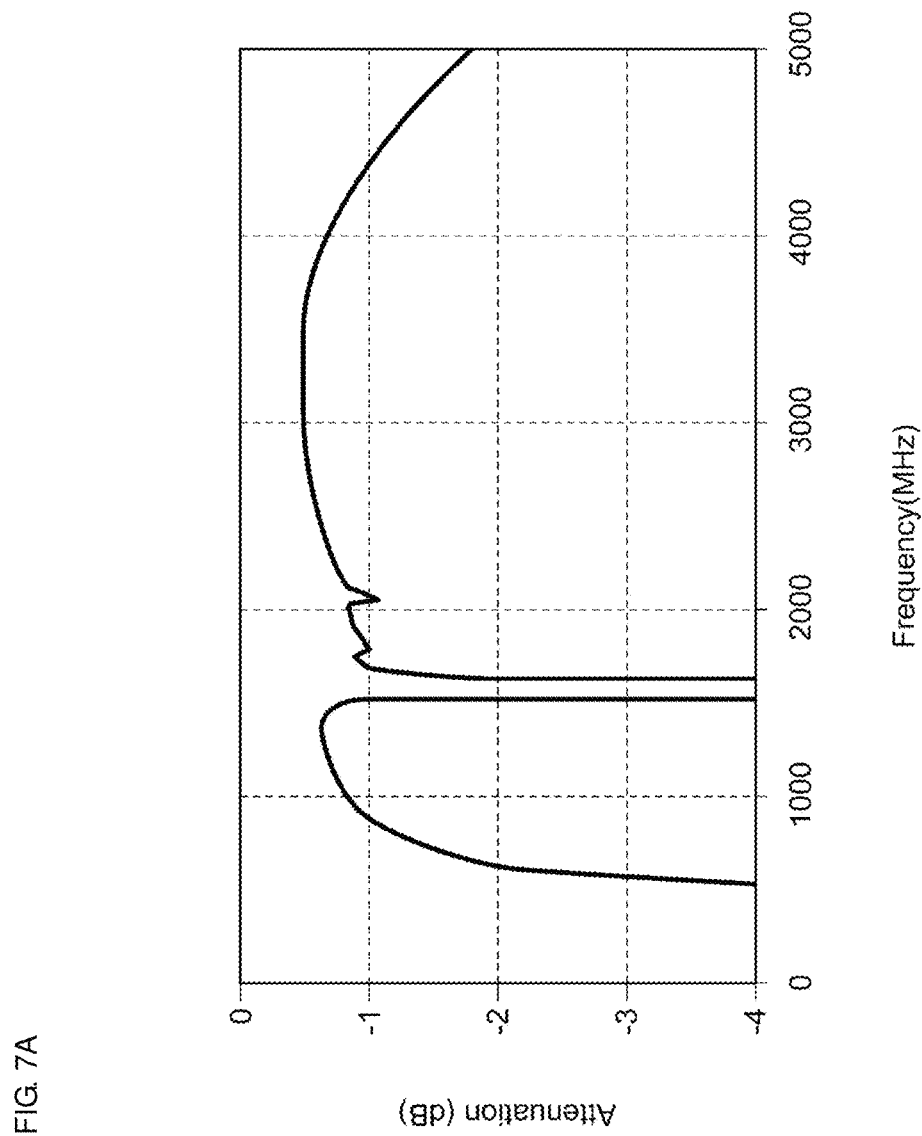
FIG. 7A is a graph representing simulation results of bandpass characteristics of a band elimination filter when the layout of the inductors illustrated in FIG. 2 is changed.
Figure 7B:
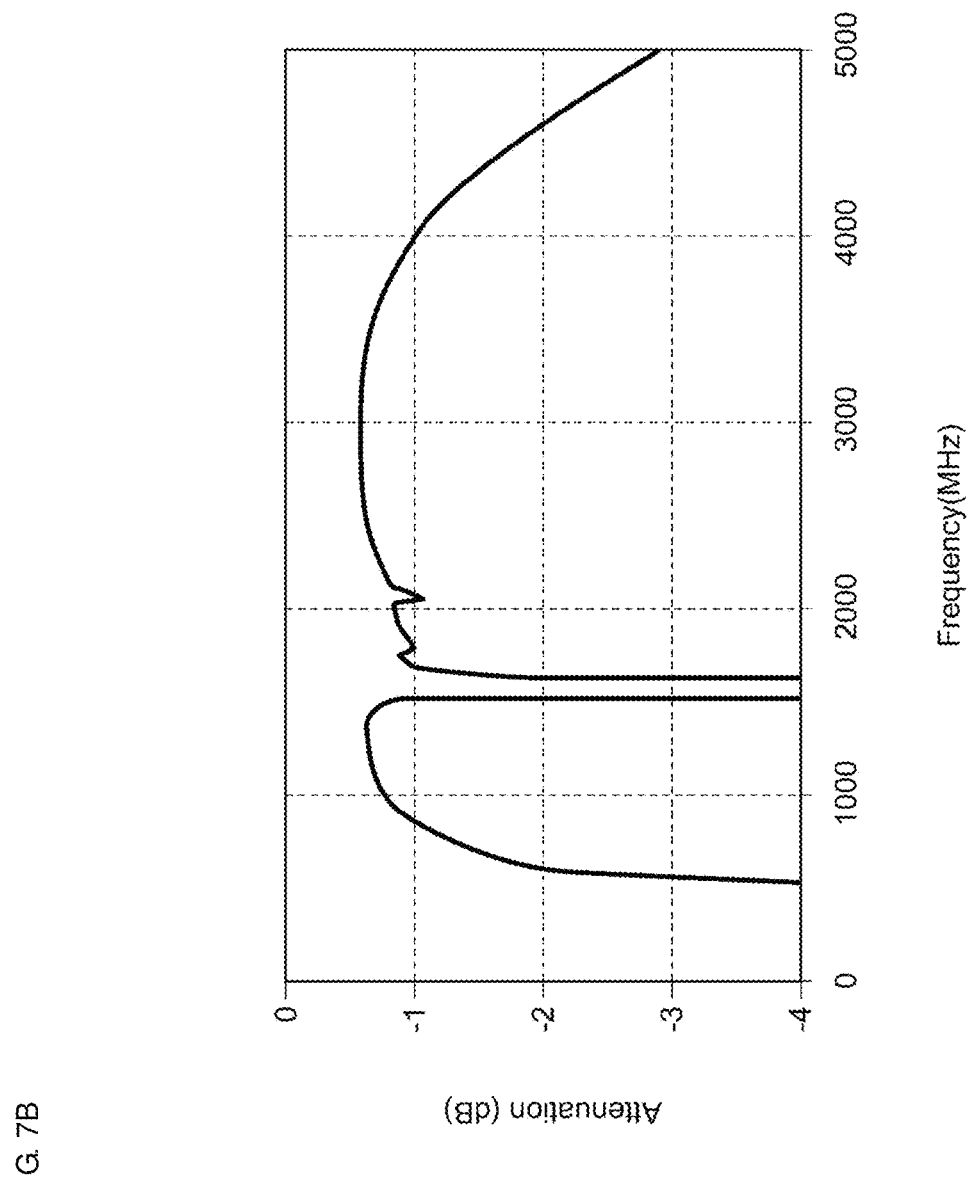
FIG. 7B is a graph representing simulation results of bandpass characteristics of a band elimination filter when the layout of the inductors illustrated in FIG. 2 is changed.

FIGS. 7A and 7B are graphs each representing simulation results of bandpass characteristics of the band elimination filter illustrated in FIG. 2. FIG. 7A illustrates a simulation result when the inductors L1 and L5 are comparatively close to each other and mutual induction occurs between them. FIG. 7B illustrates a simulation result when the inductors L1 and L5 are comparatively far from each other and mutual induction does not occur between them. In FIGS. 7A and 7B, the horizontal axis represents frequency (MHz) and the vertical axis represents attenuation (dB) in units of 1 dB.

As is apparent from the comparison between FIGS. 7A and 7B, an attenuation is improved in, in particular, the region of about 3000 MHz to about 5000 MHz when the inductors L1 and L5 are close to each other. That is, the transmission characteristics of the band elimination filter 22A are improved.

The inductor L5 may be coupled to the inductor L3, although not illustrated in FIG. 6, instead of the inductor L1. That is, the inductor L5 may be disposed to be closer to the inductor L3 than to the inductor L2. Also in this case, as in the case where the inductor L5 is coupled to the inductor L1, the transmission characteristics of the band elimination filter 22A are improved.

Exemplary preferred embodiments of the present invention have been described above. The multiplexer 20A includes the band pass filter 21A configured to pass a signal in a predetermined frequency band between a first terminal and a common terminal connected to an antenna and the band elimination filter 22A that is configured to attenuate a signal in the predetermined frequency band between a second terminal and the common terminal and includes a plurality of resonators connected in series with a line between the second terminal and the common terminal. The resonators include a first resonator having the lowest resonant frequency and a second resonator disposed on a side of the common terminal from the first resonator. Since the impedance Z2 in the pass band of the band pass filter 21A becomes higher, the leakage of a signal to the side of the band elimination filter 22A is reduced or prevented. Accordingly, the flow of a signal to the side of the band pass filter 21A is increased. This reduces or prevents the degradation in the transmission characteristics of the band pass filter 21A.

In the multiplexer 20A, the band pass filter 21A may include, between the first terminal and the common terminal, a third resonator disposed at a series arm and a fourth resonator disposed at a parallel arm. All of anti-resonant frequencies of the resonators may be higher than a resonant frequency of the fourth resonator and lower than an anti-resonant frequency of the third resonator. In this case, the pass band of the band pass filter 21A and the attenuation band of the band elimination filter 22A overlap each other.

In the multiplexer 20A, the resonators may include a fifth resonator having the largest capacitance value and a sixth resonator disposed on a side of the common terminal from the fifth resonator. In this case, since the impedance Z2 in the pass band of the band pass filter 21A becomes higher, the degradation in the transmission characteristics of the band pass filter 21A can be reduced or prevented.

In the multiplexer 20A, the first resonator and the second resonator may be adjacent to each other. The band elimination filter may further include a first inductor including one end connected to a node between the first resonator and the second resonator and the other end to which a reference potential is supplied. In this case, since the impedance Z2 in the pass band of the band pass filter 21A becomes higher, the degradation in the transmission characteristics of the band pass filter 21A can be reduced or prevented.

In the multiplexer 20A, the band elimination filter 22A may further include, between the second resonator and the common terminal, a second inductor connected in series with the second resonator. An inductance value of the first inductor may be larger than an inductance value of the second inductor. In this case, the transmission characteristics of the band pass filter 21A are further improved.

In the multiplexer 20A, the band elimination filter 22A may further include a second inductor and a third inductor that are connected in series with a line between the second terminal and the common terminal. The band pass filter 21A may further include a fourth inductor connected in series with a line between the first terminal and the common terminal. The third inductor may be disposed closer to the second inductor than to the fourth inductor. In this case, since the third inductor and the second inductor are coupled and mutual induction occurs, the transmission characteristics of the band elimination filter 22A are improved.

In the multiplexer 20A, the band elimination filter 22A may further include a third inductor connected in series with a line between the second terminal and the common terminal. The band pass filter 21A may further include a fourth inductor connected in series with a line between the first terminal and the common terminal. The multiplexer 20A may further include a fifth inductor connected in series with a line between the common terminal and a node between the band pass filter and the band elimination filter. The third inductor may be disposed closer to the fifth inductor than to the fourth inductor. In this case, since the third inductor and the fifth inductor are coupled and mutual induction occurs, the transmission characteristics of the band elimination filter 22A are improved.

The preferred embodiments described above are intended to help easily understand the present invention and is not to be used to construe the present invention in a limiting fashion. The present invention may be modified or improved without departing from the gist thereof, and equivalents of such modifications or improvements are also included in the present invention. That is, the preferred embodiments may be appropriately modified in design by those skilled in the art, and such modifications also fall within the scope of the present invention as long as the modifications include the features of preferred embodiments of the present invention. For example, elements included in the preferred embodiments described above and the arrangements, materials, conditions, shapes, sizes, and so on thereof are not limited to those illustrated exemplarily but can be modified as appropriate. Elements included in the preferred embodiments described above can be combined as much as technically possible, and such combinations of elements also fall within the scope of the present invention as long as the combinations of elements include the features of preferred embodiments of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
 a band pass filter configured to pass a signal in a predetermined frequency band between a first terminal and a common terminal connected to an antenna; and
 a band elimination filter that is configured to attenuate a signal in the predetermined frequency band between a second terminal and the common terminal and includes a plurality of resonators connected in series with a line between the second terminal and the common terminal, the plurality of resonators including a first resonator having a lowest resonant frequency among the plurality of resonators and a second resonator disposed on a side of the common terminal from the first resonator; wherein the band pass filter includes, between the first terminal and the common terminal, a third resonator provided at a series arm and a fourth resonator provided at a parallel arm; and all anti-resonant frequencies of the resonators are higher than a resonant frequency of the fourth resonator and lower than an anti-resonant frequency of the third resonator.

2. The multiplexer according to claim 1, wherein the plurality of resonators include a fifth resonator having a largest capacitance value among the plurality of resonators and a sixth resonator disposed on a side of the common terminal from the fifth resonator.

3. The multiplexer according to claim 2, wherein
the first resonator and the second resonator are adjacent to each other; and
the band elimination filter further includes a first inductor including one end connected to a node between the first resonator and the second resonator and another end to which a reference potential is supplied.

4. The multiplexer according to claim 1, wherein
the first resonator and the second resonator are adjacent to each other; and
the band elimination filter further includes a first inductor including one end connected to a node between the first resonator and the second resonator and another end to which a reference potential is supplied.

5. The multiplexer according to claim 4, wherein
the band elimination filter further includes, between the second resonator and the common terminal, a second inductor connected in series with the second resonator; and
an inductance value of the first inductor is larger than an inductance value of the second inductor.

6. The multiplexer according to claim 1, wherein
the band elimination filter further includes a second inductor and a third inductor that are connected in series with the line between the second terminal and the common terminal;
the band pass filter further includes a fourth inductor connected in series with a line between the first terminal and the common terminal; and
the third inductor is disposed closer to the second inductor than to the fourth inductor.

7. The multiplexer according to claim 6, wherein
the first resonator and the second resonator are adjacent to each other; and
the band elimination filter further includes a first inductor including one end connected to a node between the first resonator and the second resonator and another end to which a reference potential is supplied.

8. The multiplexer according to claim 1, wherein
the band elimination filter further includes a third inductor connected in series with the line between the second terminal and the common terminal;
the band pass filter further includes a fourth inductor connected in series with a line between the first terminal and the common terminal;
the multiplexer further includes a fifth inductor connected in series with a line between the common terminal and a node between the band pass filter and the band elimination filter; and
the third inductor is disposed closer to the fifth inductor than to the fourth inductor.

9. The multiplexer according to claim 1, wherein the plurality of resonators include a fifth resonator having a largest capacitance value among the plurality of resonators and a sixth resonator disposed on a side of the common terminal from the fifth resonator.

10. The multiplexer according to claim 1, wherein
the first resonator and the second resonator are adjacent to each other; and
the band elimination filter further includes a first inductor including one end connected to a node between the first resonator and the second resonator and another end to which a reference potential is supplied.

11. The multiplexer according to claim 1, wherein
the band elimination filter further includes a third inductor connected in series with the line between the second terminal and the common terminal;
the band pass filter further includes a fourth inductor connected in series with a line between the first terminal and the common terminal;
the multiplexer further includes a fifth inductor connected in series with a line between the common terminal and a node between the band pass filter and the band elimination filter; and
the third inductor is disposed closer to the fifth inductor than to the fourth inductor.

12. A communication device comprising:
the multiplexer according to claim 1; and
an antenna to which the multiplexer is connected; wherein
the multiplexer separates transmission signals to be transmitted from the antenna and reception signals received by the antenna.

13. The communication device according to claim 12, further comprising:
a switch connected to the multiplexer;
a duplexer connected to the switch;
a power amplifier connected to the duplexer;
a first low noise amplifier connected to the multiplexer;
a second low noise amplifier connected to the duplexer;
a first radio frequency integrated circuit connected to the first low noise amplifier; and
a second radio frequency integrated circuit connected to the power amplifier and to the second low noise amplifier.

14. The communication device according to claim 12, wherein the plurality of resonators include a fifth resonator having a largest capacitance value among the plurality of resonators and a sixth resonator disposed on a side of the common terminal from the fifth resonator.

15. The communication device according to claim 12, wherein
the first resonator and the second resonator are adjacent to each other; and
the band elimination filter further includes a first inductor including one end connected to a node between the first resonator and the second resonator and another end to which a reference potential is supplied.

16. The communication device according to claim 15, wherein
the band elimination filter further includes, between the second resonator and the common terminal, a second inductor connected in series with the second resonator; and
an inductance value of the first inductor is larger than an inductance value of the second inductor.

17. The communication device according to claim 12, wherein
the band elimination filter further includes a second inductor and a third inductor that are connected in series with the line between the second terminal and the common terminal;

the band pass filter further includes a fourth inductor connected in series with a line between the first terminal and the common terminal; and the third inductor is disposed closer to the second inductor than to the fourth inductor.

18. The communication device according to claim 12, wherein the band elimination filter further includes a third inductor connected in series with the line between the second terminal and the common terminal;

the band pass filter further includes a fourth inductor connected in series with a line between the first terminal and the common terminal;

the multiplexer further includes a fifth inductor connected in series with a line between the common terminal and a node between the band pass filter and the band elimination filter; and the third inductor is disposed closer to the fifth inductor than to the fourth inductor.

* * * * *